United States Patent [19]

Lefèbvre

[11] 4,328,419
[45] May 4, 1982

[54] PHOTO-ELECTRIC DETECTOR WITH TEMPERATURE-COMPENSATED CIRCUIT

[75] Inventor: Marcel Lefèbvre, Angoulême, France

[73] Assignee: La Telemecanique Electrique, France

[21] Appl. No.: 152,250

[22] Filed: May 22, 1980

[30] Foreign Application Priority Data

May 25, 1979 [FR] France ................................. 79 13316

[51] Int. Cl.³ ............................................. H01J 40/14
[52] U.S. Cl. ............................. 250/214 R; 250/214 C
[58] Field of Search ........... 250/214 R, 214 A, 214 C, 250/238; 307/310, 311

[56] References Cited

U.S. PATENT DOCUMENTS 3,992,622 11/1976 Numata et al. ..................... 307/311
4,153,835 5/1979 Lau et al. ......................... 250/214 C Primary Examiner—David C. Nelms
Attorney, Agent, or Firm—William A. Drucker

[57] ABSTRACT

Photo-electric detector comprising a multivibrator with two complementary transistors ($T_3$ and $T_4$) of which the base of the first is coupled to the collector of the second by a time constant circuit ($R_5$-$R_6$-$C_1$) comprising a resistance ($R_5$) with negative temperature coefficient. This multivibrator excites an electro-luminescent diode ($D_1$) which cooperates with a photo-transistor ($T_1$). After integration, the received signals control a commutator (thyristors $Th_1$ and $Th_2$). The circuit is fed by a rectifier bridge with diodes ($D_{11}$ to $D_{14}$) and formed with two wires.

Application to the detection of the presence of an object which blocks the luminous beam emitted by the diode ($D_1$).

7 Claims, 1 Drawing Figure

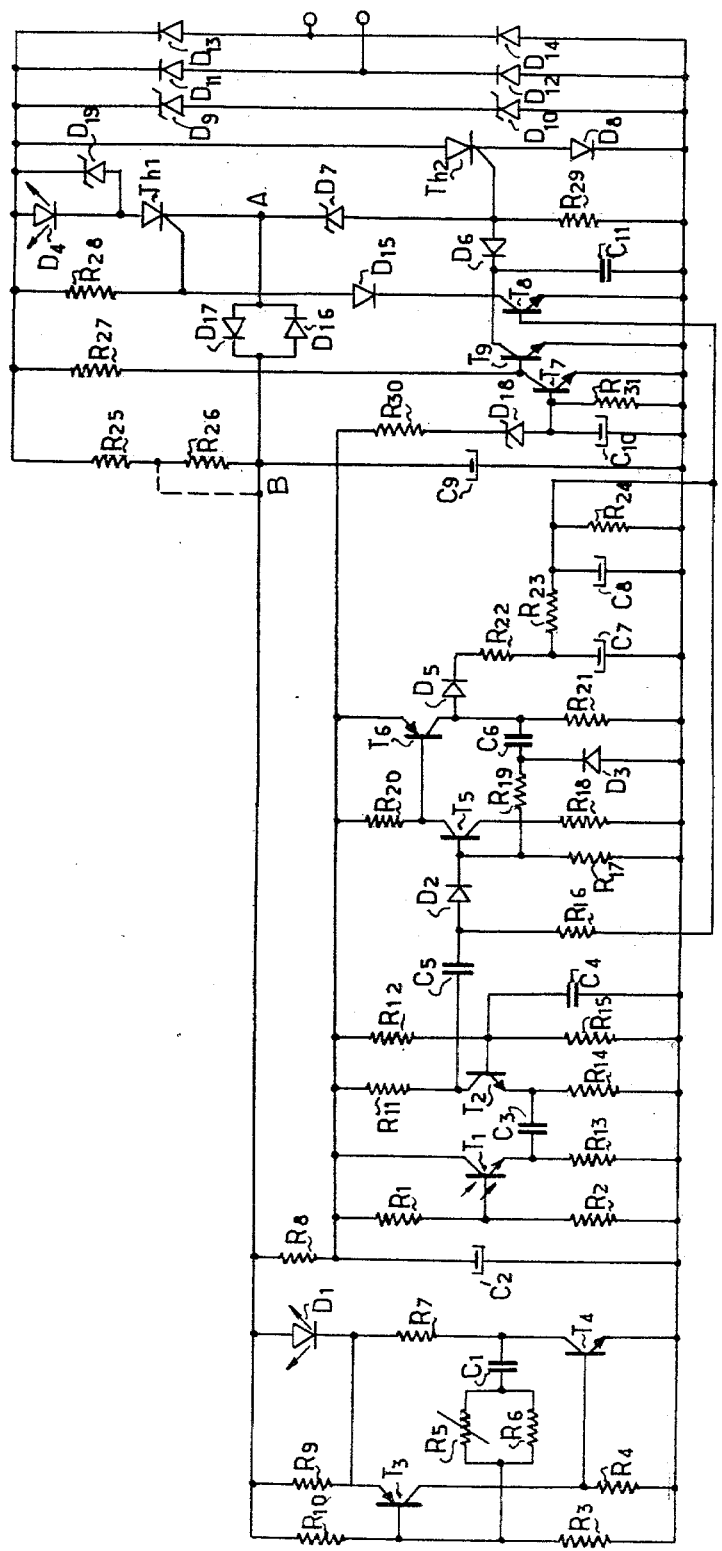

PHOTO-ELECTRIC DETECTOR WITH TEMPERATURE-COMPENSATED CIRCUIT

BACKGROUND OF THE INVENTION

The invention relates to photo-electric detectors of the presence of an object, of the type comprising an electro-luminescent diode excited by an emitter circuit and coupled to a photo-electric receiver, a circuit for integrating the current delivered by the receiver, a thyristor switching means, controlled by the integrated current, a utilisation means and a means for feeding from the sector. It concerns more particularly the devices known as "two wire", in which the switching means is connected to the terminals of non-filtered rectified current of a diode bridge connected to the sector by the utilisation means. This latter is for example a relay controlled by the switching means. This type of detector, of which the industrial applications are numerous (for example, detection of the passage of an object in the luminous beam emitted by the electro-luminescent diode in the direction of the receiver, for the purpose of initiating a certain operation) has a range of several meters, greater than that of a detector with inductive receiver. The use, well known in such a circuit, of an electro-luminescent diode, permits one to do without employing a feed transformer, and thus to reduce the bulk and the consumption of electrical energy.

When it is desired, for purposes of simplification of the circuit, to construct it in the "two wire" version, it is necessary to face up to two known difficulties. The first is that, when the switching means is in the blocked state, the current consumed by the receiver assembly (which comprises the electro-luminescent diode, the receiver and the integrator circuit) passes through the utilisation means, as a result of which this current must be reduced as much as possible. The second difficulty is that, when the switching means is conductive, it is necessary to provide an auxiliary source of feed voltage for the receiver.

It is known, in order to overcome the first difficulty, to excite the electro-luminescent diode by means of a multivibrator comprising two transistors of complementary types which are simultaneously conductive during only a very small fraction of time.

An inconvenience of this known circuit is found in the fact that the consumption increases when the ambient temperature rises, by reason of the fact that the conduction period depends upon the gain of the transistors, which itself increases with temperature.

SUMMARY OF THE INVENTION

According to an important feature of the invention, the multivibrator being of the type with two complementary transistors of which the base of the first is coupled to the collector of the second by a resistance capacity time constant circuit, the resistance comprises a resistance with negative temperature coefficient of value such that the variations of duration of conduction due to variations of the said time constant and those due to the gain of the first transistor are substantially compensated for in regard to temperature.

According to a preferred manner of construction, the value of the resistance with negative temperature coefficient is selected such that the said duration of conduction increases slightly when the temperature decreases, in order to compensate for the loss of photo-electric sensitivity of the photo-transistor at low temperatures.

In order to overcome the second difficulty mentioned above, there have been proposed various more or less complex circuits certain of which require an auxiliary thyristor: see for example the French Patent filed Dec. 3, 1976 under No. 76.36635 for "Two wire proximity detector", by the present applicant.

The invention provides a particularly simple circuit likewise requiring an auxiliary thyristor, the said circuit being arranged so that, when the said auxiliary thyristor becomes unblocked and before it causes unblocking of the principal thyristor, a condenser connected in series with the auxiliary thyristor to the rectifier terminals of the diode bridge can charge up during a brief interval of time across the said auxiliary thyristor and a diode which couples the cathode of the said auxiliary thyristor to the positive pole of the said condenser.

BRIEF DESCRIPTION OF THE DRAWING

The various features, as well as the advantages of the invention, will appear clearly in the light of the following description, accompanied by the annexed single FIGURE of drawing, which shows the layout of the circuits of a photo-electric detector conforming to a preferred manner of carrying out the invention.

DESCRIPTION OF THE PREFERRED EMBODIMENTS

The circuit shown comprises, in known manner: an emitter of luminous impulses constituted by an electro-luminescent diode $D_1$ mounted in the circuit of a multivibrator comprising two complementary transistors $T_3$, $T_4$; a receiver comprising a photo-transistor $T_1$ and an amplifying transistor $T_2$; an integrator comprising resistances $R_{22}$, $R_{23}$, $R_{24}$ and condensors $C_7$ and $C_8$, and a thyristor switching device which comprises here two thyristors $Th_1$ and $Th_2$ and a transistor $T_8$. The feed voltage is provided by a bridge of diodes $D_{11}$ to $D_{14}$ connected to the network across the load, not shown, the circuit being of the two wire type.

The feeding of the emitter and of the whole of the reception and integration means is carried out at low voltage and is taken to the terminals of a condensor $C_9$ which serves as a reservoir and which charges itself when the beam is broken, during the first part of each alternation of the sector voltage, as is now going to be explained:

The base of the transistor $T_8$, which is of the NPN type (as are the other transistors of the circuit given by way of example, with the exception of $T_3$ and $T_6$) is coupled on the one hand to a collector of the transistor $T_2$ by means of a condensor $C_5$ and of a resistance $R_{16}$, and on the other hand to the common point of the resistances $R_{23}$ and $R_{24}$ and the condensor $C_8$.

When the beam is broken, there is no voltage on the base of $T_8$, because this transistor is blocked. As a result the tension of the striker of $Th_1$ (which striker is coupled to the collector of $T_8$ by a diode $D_{15}$) has a high value and a striker current is established across a resistance $R_{28}$ in series with $D_{15}$ and $T_8$ to the terminals of the diode bridge $D_{11}$–$D_{14}$. The thyristor $Th_1$ fires, thereby opening a conductive path to the terminals of the bridge $D_{11}$–$D_{14}$, which passes through an electro-luminescent diode $D_4$ (which thus indicates the broken state of the beam), the thyristor $Th_1$, a Zener diode $D_7$ and a resistance $R_{29}$. The condenser $C_9$ firstly charges itself across a diode $D_{17}$ which couples one of its electrodes to the point A common to the cathode of $Th_1$ and that of the Zener diode $D_7$. As soon as the voltage at A reaches a value, for example 8.2 volts, which corresponds to the inverse voltage of the Zener diode $D_7$, this latter goes to output which causes a rise in voltage of the striker of $Th_2$, taken to the terminals of $R_{29}$, until there is a sufficient value for the said thyristor to fire. $Th_2$, which is advantageously of a calibre greater than $Th_1$, thus takes over from the latter. Obviously $C_9$ stops charging.

When the beam is not broken, the transistor $T_8$ is in the saturated condition, because the voltage of the striker of $Th_1$ is of the order of 0.8 v. (the sum of the voltage drops in $D_{15}$ and $T_8$). $Th_1$ is thus in the blocked condition so that the striker of $Th_2$ is at earth and this latter thyristor is itself blocked. This blocking is assisted by the presence of a diode $D_8$ between the cathode of $Th_2$ and earth. During the intervals of time when $Th_2$ is blocked, $C_9$ charges itself across two resistances $R_{25}$, $R_{26}$. When it is thus, the charge of $C_9$ is regulated, by the diodes $D_{16}$ and $D_7$ to the value of the sum of the voltage drops at the terminals of these two diodes, that is to say to $0.6 + 8.2 = 8.8$ volts. On the other hand, during the intervals of time when, as has been explained above, the charge of $C_9$ takes place across $D_{17}$ (with the beam broken), the voltage at the terminals of $C_9$ is adjusted to a value of $8.2 - 0.6 = 7.6$ volts.

It will be seen, therefore, that the voltage at the terminals of $C_9$ is greater when the beam is unbroken. As a result the current which passes through the electro-luminescent diode $D_1$, and thus the intensity of the light emitted increases at the moment when the beam is no longer broken and, inversely, decreases at the moment when it is broken, which finally facilitates the transitions and avoids phenomena of oscillation.

There is now described a device, comprising two transistors of the NPN type, intended to avoid an inadvertent detection of the presence of an object at the moment of placing the circuit under voltage. This detection risks being produced as a result of the fact that, during the placing of the circuit under voltage, the charge of the condenser $C_9$ takes a certain time (150 ms for example), during which the luminescent beam progressively developes. Until it is established, $T_8$ would thus be blocked and $Th_1$, then $Th_2$, unblocked.

This inadvertent switching is avoided in the following manner:

The transistor $T_9$, as soon as the circuit is placed under voltage, is submitted to a base polarisation voltage across a resistance $R_{27}$. It is thus open and, being mounted in parallel to $T_8$ (then blocked) it lowers the striker voltage of $Th_1$ in such a manner as to prevent the firing of $Th_1$. There is accordingly no switching.

As soon as the voltage is established at a sufficient value at the terminals of $C_9$, a Zener diode $D_{18}$, coupled to the terminal B of $C_9$ across two resistances $R_8$ and $R_{30}$ in series, becomes unblocked (for example at 6.2 volts). A condenser $C_{10}$, in series with $D_{18}$ then charges, until the moment when it polarises the base of the transistor $T_7$, which become unblocked. The conduction of $T_7$ eliminates the base current of $T_9$, which becomes blocked. At this moment, the device $T_7$-$T_9$ has in any event been placed out of use and the switching can take place normally in the presence of an object which breaks the beam.

There is now described the emitter, constituted by two complementary transistors $T_3$ and $T_4$ connected as a multivibrator in the following manner:

The emitter of $T_3$ is coupled to the feed point B by means of a resistance $R_9$, its collector being coupled on the one hand to earth across a resistance $R_4$, and on the other hand to the base of $T_4$. The base of $T_3$ is polarised, starting from the voltage at B, through a resistance bridge $R_{10}$-$R_3$, the common point of which is coupled to the collector of $T_4$ by a time constant circuit comprising a fixed resistance $R_6$ in parallel with a resistance $R_5$ having a negative temperature coefficient, this parallel assembly being in series with a condenser $C_1$. The transistor $T_4$ is in series with the electro-luminescent diode $D_1$ and a resistance $R_7$ and the common point of these latter components is coupled to the common point between $R_9$ and $T_3$.

If one considers an arbitary moment of the operation of the multivibrator circuit $T_3$-$T_4$ and $T_3$ and $T_4$ are saturated, the emitter-base current of $T_3$ passes through $R_9$, $R_5$ and $R_6$ and progressively charges $C_1$. This current, multiplied by the current gain of $T_3$, serves as base current for $T_4$ and it decreases exponentially during the charging of $C_1$, until it becomes insufficient to ensure the saturation of $T_4$. At this moment the transistor $T_4$ passes into a state of linear operation; its collector potential increases again and this increase of potential is transmitted, through $C_1$, $R_5$-$R_6$ to the base of $T_3$, as a result of which there is blocking of this latter and, consequently, blocking of $T_4$. At this moment, the collector potential of $T_4$ again increases more rapidly, up to the value of the voltage at B, which results in further ensuring the blocking of $T_3$, during the whole of the duration of the discharge of $C_1$ across $R_5$-$R_6$-$R_3$. At the end of this discharge, $T_3$ becomes conductive again and a new cycle commences.

The circuit finally delivers current pulses of the order of 1A (an order of size which is suitable to give the electro-luminescent diode an acceptable range), with a cyclic ratio of the order of 1/1000 (duration of the pulses: about 4 micro-sec.; interval between pulses: 4 milli-sec.). The mean current consumed by the electro-luminescent diode is thus of the order of 1 mA; the multivibrator has, for its part, a negligible consumption.

The advantages of such an emitter circuit are known. Its inconvenience, in the prior art, lies in the fact that the duration of the pulses depends partly on the gain of the transistors, which varies considerably with temperature. As a result there are inadmissable variations of the consumption of the emitter circuit when "resting", that is to say when the beam is not broken.

In the circuit described, this inconvenience is eliminated by reason of the fact that the resistance $R_5$ assumes very low values at high temperatures, for which the gain of $T_3$ or of $T_4$ is high, for their part.

It results from the explanations given hereinabove that the duration of conduction depends upon the constant of the period of charge of $C_1$ across the circuit $R_5$-$R_6$, and upon the gain of the transistor $T_3$. These two factors varying in inverse direction as the temperature increases, it is possible to keep this duration constant. In practice, it is preferable to choose the values of the parameters so that the pulses shall be a little longer at low temperatures than at medium temperatures, in order to take into account the fact that the efficiency of the photo-transistor lowers when the temperature lowers.

Another feature of the emitter circuit described lies in the presence of the counter-reaction resistance $R_9$ which couples the terminal B to the emitter of $T_3$. The drop of voltage in this resistance during the periods of conduction has the effect of causing the transistor $T_3$ to operate in linear manner, essentially unstable, which avoids any risk that the multivibrator can remain permanently in conductive state.

If the receptor circuit is now considered, it will be seen that the photo-transistor $T_1$, connected with common collector, is polarised by a circuit comprising the resistances $R_8$, $R_1$ and $R_2$ in series with a condenser $C_2$ mounted in parallel with $R_1$, $R_2$. The counter-reaction inherent to the common collector circuit, which considerably reduces any interference, provides for the circuit a good immunity to continuous ambient light.

The amplifier transistor $T_2$, connected with common base, has an extremely low input impedance, which increases the rapidity of the photo-transistor $T_1$. The components $T_1$ and $T_2$ consume only a low current.

A feature of the circuit of the drawing is found in the fact that the pulses, available on the collector resistance $R_{11}$ of $T_2$, are not applied directly to the integrator circuit ($C_7$–$C_8$–$R_{22}$–$R_{23}$–$R_{24}$) but are firstly put into order by a monostable multi-vibrator composed of two complementary transistors $T_5$ and $T_6$. The elements of the circuit of this multi-vibrator (resistances $R_{20}$, $R_{17}$, $R_{19}$, $R_{21}$; condenser $C_6$, diode $D_3$) are adjusted so that the period of conduction of $T_5$ and $T_6$ shall be about equal to half of the period of the emitter circuit, for example 2 ms. In this manner, there is eliminated the lack of symmetry of the constant of charging period and discharging period of the condensers of the integrator, which lack of symmetry would give the circuit very different response times according to whether the beam was broken or resumed, which would be disadvantageous not only during use but also for the protection of the circuit against disturbances.

It will be obvious that various modifications could be made to the circuit described and shown, without exceeding the scope of the invention. The circuit shown in the drawing is in particular of the type in which the switching means is conductive when the beam is broken.

A circuit of the type in which the switching means would be non-conductive when the beam is broken could obviously comprise an inverter means between the integrator circuit and the transistor $T_8$. On the other hand, the protection device constituted by the transistors $T_7$ and $T_9$ could be eliminated.

The remainder of the circuit could be identical to that shown.

I claim:

1. In a photo-electric detector of the presence of an object, of the kind comprising an electro-luminescent diode excited by an emitter circuit and coupled to a photo-electric receiver, a circuit for integrating the current delivered by the receiver, a thyristor switching means, controlled by the integrated current, a utilisation means, the switching means being connected to the terminals of non-filtered rectified current of a diode bridge connected to the sector by means of the utilisation means, and the emitter circuit being constituted by a monostable multivibrator comprising two transistors of complementary types the base of the first of which is coupled to the collector of the second by a resistance capacity time constant circuit, the improvement that the said time constant circuit comprises a resistance with negative temperature coefficient of value such that the product of the said time constant, by the gain of the first transistor, shall be substantially independent of temperature.

2. A photo-electric detector, according to claim 1, wherein the value of the resistance with negative temperature coefficient is selected such that the said product increases slightly when the temperature decreases, in order to compensate for the reduction of sensitivity at low temperatures of the photo-transistor which the said photo-electric receiver comprises.

3. A photo-electric detector, according to claim 1 or 2 wherein the said multivibrator comprises a counter-reaction resistance connected in the emitter circuit of the first transistor.

4. A photo-electric detector, according to claim 1, wherein the switching means comprises a principal thyristor, an auxiliary thyristor and a condenser connected in parallel with the rectifying terminals of the bridge, the said condenser being coupled to a first one of the said terminals to which are coupled the anodes of the two thyristors, by means of a first resistance and the cathode of the auxiliary thyristor being coupled to the second of the said terminals by means of a Zener diode in series with a second resistance, the point common to the auxiliary thyristor and to the Zener diode being coupled to the point common to the said condenser and to the first resistance by means of two diodes connected in parallel-opposition, the point common to the Zener diode and to the second resistance being coupled to the striker of the principal thyristor, and means for unblocking the auxiliary thyristor upon the occurrence or disappearance of the current in the receiver.

5. A photo-electric detector, according to claim 4 wherein the said means for unblocking the auxiliary thyristor comprise an unblocking transistor the base of which is coupled to the output of the receiver circuit and of which the collector is coupled to the striker of the auxiliary thyristor.

6. A photo-electric detector, according to claim 5 having a first auxiliary transistor connected to the rectifier terminals of the bridge by a second auxiliary transistor connected in parallel on the said unblocking transistor and of the same type as the latter and of which the base is coupled to the said first terminal through a polarisation resistance, the base of the first auxiliary transistor being coupled to the common point between the said condenser and the said first resistance by means of a resistance in series with a Zener diode, and to the second terminal by means of a condenser, the collector of the first auxiliary transistor being coupled to the base of the second.

7. A photo-electric detector, according to claim 1, having a monostable multivibrator which couples the said receiver to the said integrator circuit and has a conduction period equal to half of the period of recurrence of the pulses delivered by the receiver.

* * * * *